(12) United States Patent
Agari

(10) Patent No.: US 7,021,467 B2
(45) Date of Patent: Apr. 4, 2006

(54) CARRIER TAPE FOR CONTAINING GOOD THEREIN, AND CONTAINER USING THE CARRIER TAPE

(75) Inventor: Hironobu Agari, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 102 days.

(21) Appl. No.: 10/413,180

(22) Filed: Apr. 14, 2003

(65) Prior Publication Data

US 2003/0196930 A1    Oct. 23, 2003

(30) Foreign Application Priority Data

Apr. 19, 2002   (JP) ............................. 2002-118618

(51) Int. Cl.
*B65D 85/90*     (2006.01)

(52) U.S. Cl. ........................................... 206/714

(58) Field of Classification Search ........ 206/713–714, 206/716, 390, 820
See application file for complete search history.

(56) References Cited

U.S. PATENT DOCUMENTS

| | | | |
|---|---|---|---|
| 5,992,639 A * | 11/1999 | Naito et al. | 206/714 |
| 6,270,614 B1 * | 8/2001 | Naito et al. | 156/272.2 |
| 6,425,484 B1 * | 7/2002 | Sakurai | 206/714 |
| 6,729,474 B1 * | 5/2004 | Hong et al. | 206/714 |

FOREIGN PATENT DOCUMENTS

JP   046770   2/2002

* cited by examiner

*Primary Examiner*—Bryon P. Gehman
(74) *Attorney, Agent, or Firm*—Cooper & Dunham LLP

(57) ABSTRACT

A carrier tape including a main body; plural pockets arranged on the main body and configured to contain goods therein, wherein the pockets have depths greater than the thickness of the main body, and wherein the pockets are arranged at equal intervals in a longitudinal direction of the main body; and plural dummy pockets arranged on the main body, wherein the dummy pockets extend away from the main body no less than the pockets. The dummy pockets can be replaced with ribs having a plate shape. A container including the carrier tape and a resin cover tape which covers the pockets and the dummy pockets. The container can be reeled.

23 Claims, 12 Drawing Sheets

CARRIER TAPE FOR CONTAINING GOOD THEREIN, AND CONTAINER USING THE CARRIER TAPE

BACKGROUND OF THE INVENTION

1. Field of the Invention

The present invention relates to a carrier tape for containing a small good such as chip size packages (hereinafter sometimes referred to as CSPs) for use in semiconductor devices and microphones for use in cellular phones, and a container using the carrier tape.

2. discussion of the Related Art

In general, when chips for use in semiconductor devices are manufactured, the electric properties of the manufactured chips are checked in the final stage of the production process to determine whether the chips do not have a defect, and then only non-defective chips are packaged in a predetermined wrapper to be shipped. This operation is automatically performed now. When such chips are packaged, a method in which the chips are contained in each of recessed portions of an embossed tape (i.e., a carrier tape), which recessed portions are arranged in the longitudinal direction of the carrier tape at equal intervals. Then the recessed portions are covered with a cover tape, and thereby the chips are enclosed in the carrier tape.

FIGS. 11A and 11B are schematic views illustrating a conventional carrier tape. FIG. 11A is a plane view of the conventional carrier tape, and FIG. 11B is a cross sectional view of the conventional carrier tape when the carrier tape is cut at a line of B—B. A cover tape 12 is illustrated in FIG. 11B but is not illustrated in FIG. 11A.

Referring to FIGS. 11A and 11B, numeral 2 denotes a carrier tape which is typically made of a flexible resin. In the carrier tape 2, pockets 4 (i.e., embossed portions) are formed in the longitudinal direction of the carrier tape 2 to contain a good 6 such as CSPs therein. It is supposed that in this embodiment a CSP is contained in each of the pockets 4. The CSP 6 is contained in the pocket 4 such that the electrode terminals, such as solder terminals, of the CSP 6 face downward.

The pockets 4 are arranged at equal intervals in a line in the longitudinal direction of the carrier tape 2. In addition, holes 8 which are used for periodically feeding the carrier tape 2 are also formed at equal intervals in a line in the longitudinal direction of the carrier tape 2 such that the line of the holes 8 is parallel to the line of the pockets 4.

The flat surface of the carrier tape 2 on the side in which openings of the pockets 4 are formed serves as a flange portion 10. On the flange portion 10, the cover tape 12 is provided to seal the CSP 6 using an adhesive or a heat/pressure method.

The carrier tape 2 in which the CSP 6 is contained in the pockets 4 and is sealed with the cover tape 12 is reeled such that the cover tape 12 faces outward. FIG. 12 illustrates a cross section of a portion of the reeled carrier tape 12. Referring to FIG. 12, a pocket 4b is located right on another pocket 4a. In FIG. 12, the pocket 4a is located on an inner side of the reeled carrier tape. Numeral 38 denotes a good (a CSP in this case) contained in the pockets 4a and 4b.

In general, the pockets 4 are formed such that the area of the outer surface of the bottom of the pockets 4 is smaller than the area of the opening of the pockets 4, in order that the CSPs 6 can be easily contained in or taken out of the pockets 4. Even when it is taken into consideration that the carrier tape 2 has a thickness, the area of the outer surface of the bottom of the pockets 4 is still smaller than that of the opening of the pockets 4. Therefore, when the pocket 4b is located right on the pocket 4a as illustrated in FIG. 12, the bottom portion of the upper pocket 4b invades the opening of the lower pocket 4a if a force is applied to the pockets 4a and 4b, for example, when the carrier tape 2 is reeled or the reeled carrier tape 2 is transported. This phenomenon is called "nesting".

In this case, if the good 6 is a CSP having a BGA (Ball Grid Array) type solder terminal, the solder terminal is deformed due to the nesting. Goods other than the CSPs can be often damaged due to the nesting.

In attempting to prevent the nesting, Unexamined Japanese Patent Application 2002-046770 discloses a carrier tape in which the structure of the inner wall of the pockets is changed. In the carrier tape, a rib is formed on the pocket so as to extend outward. Since the size of the bottom of the pocket including the rib is larger than that of the opening thereof, the nesting problem can be prevented.

By using this technique, there is no problem when relatively large goods are contained in the carrier tape. However, when a small good such as CSPs is contained therein, the functionality of the carrier tape is deteriorated because the ribs which do not serve to support the good, have to be formed in the pockets.

Because of these reasons, a need exists for a carrier tape which can prevent the nesting without changing the pocket itself.

SUMMARY OF THE INVENTION

Accordingly, an object of the present invention is to provide a carrier tape which can prevent the nesting without changing the constitution of the pocket itself.

To achieve such an object, the present invention contemplates the provision of a carrier tape including:

a main body;

plural pockets arranged on one side of the main body and configured to contain a good therein, wherein the plural pockets have a depth greater than the thickness of the carrier tape and are arranged at equal intervals in a longitudinal direction of the carrier tape; and plural dummy pockets recessed in the same direction as that of the pockets and having a height equal to or greater than the height of the plural pockets, wherein the good is not contained in the plural dummy pockets.

At this point, the depth of the pockets and the dummy pockets is defined as a distance between the opening surface thereof and the inner surface of the bottom thereof. The height of the pockets and the dummy pockets is defined as a distance between the opening surface thereof and the outer surface of the bottom thereof.

It is preferable that the dummy pockets have a dimension such that when one of the dummy pockets is located right on one of the pockets, at least one portion of the bottom portion of the dummy pocket extends off the opening of the pocket located below the dummy pocket to prevent the nesting.

In this case, it is preferable that the length of one of the outer surface of the bottom of the dummy pockets and the opening of the pockets is longer than the other in the longitudinal direction of the carrier tape and is shorter than the other in the direction perpendicular to the longitudinal direction. Alternatively, the shape of the outer surface of the bottom of the dummy pockets may be different from the shape of the opening of the pockets.

Alternatively, the height of both end portions of the dummy pockets in at least one of the longitudinal direction and the direction perpendicular to the longitudinal direction is greater than that of the center portion of the dummy pockets, and the dummy pockets have a shape such that when one of the dummy pockets is located right on one of the pockets, the outer surface of the bottom of both the end portions of the dummy pocket extends off the opening of the pocket. Alternatively, the length in the longitudinal direction of both the end portions of the dummy pockets is longer than that of the center portion thereof. In this case, the dummy pockets have a shape such that when one of the dummy pockets is located right on one of the pockets, the outer surface of the bottom of both the end portions of the dummy pocket extends off the opening of the pocket.

It is preferable that the sidewalls of the dummy pockets are substantially perpendicular to the surface of the carrier tape, i.e., the opening of the dummy pockets has the same shape as that of the inner surface of the bottom thereof.

Alternatively, the carrier tape may be a carrier tape which includes:

a main body;

plural pockets arranged on one side of the main body and configured to contain a good therein, wherein the plural pockets have a depth greater than the thickness of the carrier tape and are arranged at equal intervals in a longitudinal direction of the carrier tape; and plural ribs each having at least a portion having a height equal to or greater than the height of the plural pockets, wherein the ribs are integrated with the carrier tape.

It is preferable that the pockets and the ribs are arranged side by side in the longitudinal direction of the carrier tape, wherein the length of the ribs in the longitudinal direction is longer than that of the opening of the pockets. It is preferable that each of the ribs is separated into plural pieces in the longitudinal direction of the main body. The ribs may be formed at a location other than the inter-pocket area (i.e., the area between one of the pockets and the adjacent pocket).

It is preferable that the pockets have substantially a rectangular form when observed from above and the sidewalls of the pockets are tapered such that the area of the opening is larger than that of the inner surface of the bottom, wherein the good contained in the pockets is supported by the tapered four sidewalls of the pockets while the bottom of the good does not contact the bottom of the pockets.

It is preferable that the tapered sidewalls have a projection configured to support the bottom of the good such that the bottom of the good does not contact the bottom of the pocket. In this case, it is preferable that each of the four corners of the sidewalls is recessed outward.

In another aspect of the present invention, a container is provided which includes:

the carrier tape as mentioned above; and a resin cover tape configured to cover the opening of the pocket (and the dummy pocket) of the carrier tape, i.e., to seal the good in the pocket.

In this case, the container may be reeled such that the cover tape faces outward.

These and other objects, features and advantages of the present invention will become apparent upon consideration of the following description of the preferred embodiments of the present invention taken in conjunction with the accompanying drawings.

DESCRIPTION OF THE PREFERRED EMBODIMENTS

Figure 1A:
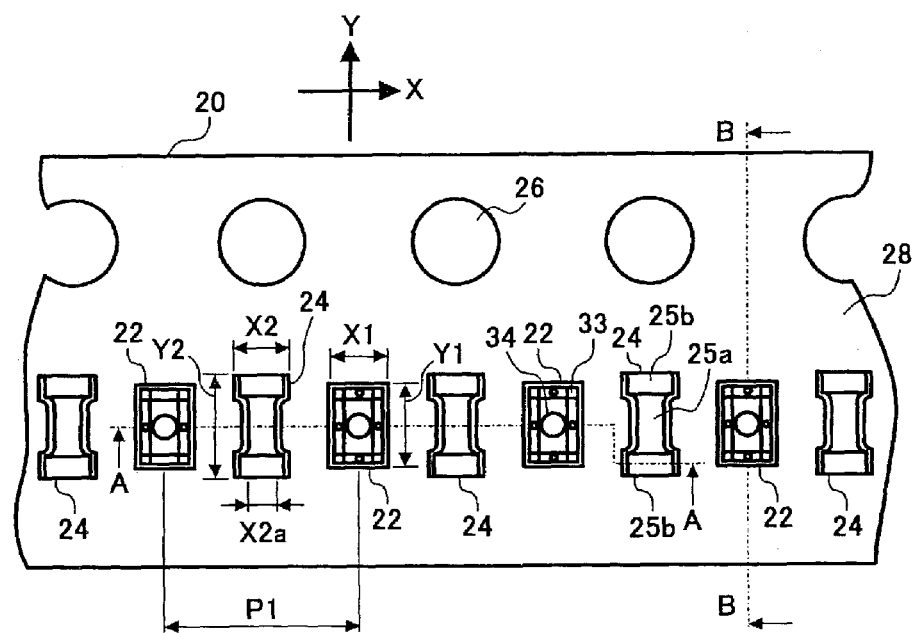
FIG. 1A is a schematic plan view illustrating a first embodiment (Example 1) of the carrier tape of the present invention.

In the first aspect of the carrier tape of the present invention, dummy pockets are formed on the carrier tape such that at least a portion of the outer surface of the bottom of the dummy pockets extends off the opening (i.e., the upper portion) of the pockets in which a good is contained. When the carrier tape has such a constitution and is reeled, a dummy pocket located right on a pocket does not invade into the pocket, i.e., the nesting problem is not caused.

An example of the carrier tape having such a constitution as mentioned above is that the length of one of the outer surface of the bottom portion of the dummy pockets and the opening of the pockets is longer than the other in the longitudinal direction of the carrier tape and is shorter than the other in the direction perpendicular to the longitudinal direction.

Another example of the carrier tape having such a constitution as mentioned above is that the outer surface of the dummy pocket has a shape different from that of the opening of the pocket.

Yet another example of the carrier tape having such a constitution as mentioned above is that the height of both end portions of the dummy pockets in at least one of the longitudinal direction and the direction perpendicular to the longitudinal direction is greater than that of the center portion of the dummy pockets, and the dummy pockets have a shape such that when one of the dummy pockets is located right on one of the pockets, the outer surface of the bottom portions of both the end portions of the dummy pockets extend off the opening of the pocket.

A further example of the carrier tape having such a constitution as mentioned above is that the length of both the end portions of the dummy pocket in the longitudinal direction is longer than that of the center portion of the dummy pocket, and the dummy pockets have a shape such that when one of the dummy pockets is located right on one of the pockets, at least a portion of the bottom portions of both the end portions of the dummy pocket extends off the opening of the pocket.

It is preferable that the sidewalls of the dummy pockets are perpendicular to the surface of the carrier tape, i.e., the shape of the opening is the same as that of the inner surface of the bottom of the dummy pocket. Since the carrier tape has a thickness, the area of the outer surface of the bottom of the dummy pockets is larger than that of the opening.

When the carrier tape is reeled, there is a case in which a pocket is located right on another pocket and a dummy pocket adjacent to the pocket is also located right on another dummy pocket. In this case, since the outer surface of the bottom of the dummy pocket is larger than the opening thereof, the upper dummy pocket does not invade into the lower dummy pocket. Therefore, the distance between a portion of the reeled carrier tape and the adjacent upper (or lower) portion of the reeled carrier tape can be maintained. Accordingly, even when a pocket is located right on another pocket, the upper pocket never invade the lower pocket, i.e., occurrence of the nesting problem can be prevented.

As the second aspect of the carrier tape of the present invention, ribs are arranged on the main body in the longitudinal direction of the main body such that the ribs project in the same direction as that of the pocket and the ribs and the pockets are arranged side by side.

It is preferable that a rib is separated into plural pieces to easily reel the carrier tape because the carrier tape can be curved in the longitudinal direction thereof.

Ribs can be formed at a location other than the interpocket areas. When the carrier tape is reeled and a pocket is located right on another pocket, the greater the number of ribs, the more easily the distance between the upper pocket and the lower pocket can be maintained, and thereby the outer surface of the bottom of the upper pocket can be prevented from invading the lower pocket, resulting in prevention of the nesting problem.

According to the present invention, by forming dummy pockets or ribs, invasion of the upper pocket into the lower pocket can be prevented regardless of the shape of the pockets formed on the carrier tape to contain a good. Namely, the pockets can be designed such that the good to be contained therein can be easily contained therein and taken therefrom.

An example of the shape of the pockets is a rectangular form when the pockets are observed from above. In addition, the sidewalls of the pockets are preferably tapered such that the area of the opening of the pockets is greater than that of the inner surface of the bottom thereof. It is also preferable that when the good to be contained is set in the pocket such that the good contacts the four tapered sidewalls of the pockets, any portions of the bottom of the good do not contact the bottom surface of the pocket. Thus, by supporting the good with the four sidewalls while preventing contact of the bottom of the good with the bottom of the pocket, mechanically weak portions of the good, such as soldered portions, can be protected.

It is more preferable that the tapered sidewalls have projections which can support the good such that any portions of the bottom of the good do not contact the bottom surface of the pocket. By forming such projections, a small good which cannot be supported by the tapered sidewalls can be supported without contacting the bottom thereof with the bottom surface of the pocket.

Another example of the pockets having tapered sidewalls is that the four corners of the four sidewalls are relatively recessed outward compared to the tapered portions. When the pocket has such a constitution, a good can be contained in the pocket while the corners of the good do not contact the sidewalls of the pocket, and thereby the good can be stably contained therein.

After a good is contained in a pocket of the carrier tape of the present invention, the opening of the pocket is sealed with a cover tape (i.e., a cover sheet) which is typically made of a resin. This is the container of the present invention which can contain a small good therein without damaging the good.

The container of the present invention may be reeled. Namely, an embodiment of the container of the present invention is a reeled container in which a resin cover tape is provided on the opening of the pockets of the carrier tape to seal a good in the pockets (and the opening of the dummy pockets if any) which is reeled such that the cover tape faces outward.

Having generally described this invention, further understanding can be obtained by reference to certain specific examples which are provided herein for the purpose of illustration only and are not intended to be limiting. In the descriptions in the following examples, the numbers represent weight ratios in parts, unless otherwise specified.

EXAMPLES

Example 1

Figure 1B:
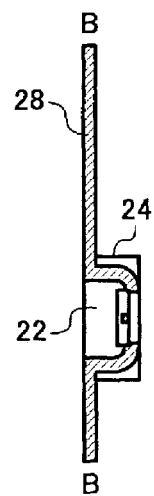
FIG. 1B is a schematic diagram illustrating a sectional view of the carrier tape illustrated in FIG. 1A when the carrier tape is cut at a line B—B.
Figure 1C:
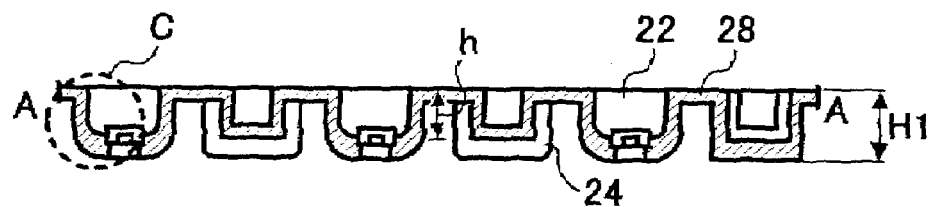
FIG. 1C is a schematic diagram illustrating a sectional view of the carrier tape illustrated in FIG. 1A when the carrier tape is cut at a line A—A.

FIG. 1A is a plan view of the first example of the carrier tape of the present invention. FIGS. 1B and 1C are cross sectional views of the carrier tape when the carrier tape is cut at a line B—B and A—A, respectively.

This carrier tape is typically used for containing a BGA-type CSP. Referring to FIGS. 1A–1C, numeral 20 denotes a main body of the carrier tape, which is made of a polycarbonate resin and has a flexibility. The thickness of the main body of the carrier tape is 0.18 mm. Numeral 22 denotes a pocket which is configured to contain a good therein and which is an embossed portion having a bottom. The pocket typically has a rectangular form when observed from above. Plural pockets, which have the same shape and are embossed in the same direction, are formed in the longitudinal direction at a pitch P1 of 4 mm. The opening of the pocket has the following dimensions:

X1: 1.08 mm, and
Y1: 1.58 mm.

A dummy pocket 24 is formed between two adjacent pockets 22 and 22. The dummy pocket 24 has an embossed portion which has a bottom surface and which is recessed in the same direction as that of the pocket 22. The dummy pocket 24 has an I form. Namely, a width X2 of both the end sides of the dummy pocket 24 in the longitudinal direction (i.e., in an X direction in FIG. 1A) of the main body 20 is greater than a width X2a of the center portion of the dummy pocket 24. The width X2 is 1.1 mm in this case, which is greater than a width of X1 (i.e., 1.08 mm) of the pocket 22. The width X2a is 0.7 mm in this case. A length Y2 of the dummy pocket 24 in a Y direction perpendicular to the longitudinal direction is greater than a length Y1 of the pocket 22 in the Y direction. In this case, the length Y2 is 2.0 mm whereas the length Y1 is 1.58 mm.

On a side of the main body 20 opposite to the side in which the pockets 22 and dummy pockets 24 are formed, a hole 26 is formed in the X direction at equal intervals. The carrier tape is fed using the holes 26. The holes 26 may be formed on both sides of the pockets 22 and dummy pockets 24.

The surface of the main body 20 (i.e., the surface having openings of the pockets 22 and dummy pockets 24) is a flat surface. The flat surface serves as a flange portion 28 to which a cover tape is adhered by a heat-pressure method or using an adhesive to seal a good in the pocket 22. The cover tape is adhered on the flange such that the cover tape covers the pockets 22 and dummy pockets 24 without covering the holes 26.

An opening 34 is optionally formed on each pocket 22. The opening 34 is formed to check whether a good is contained in the pocket 22 and to avoid pressure change occurring when the cover tape is adhered on the pocket 22.

Figure 2:
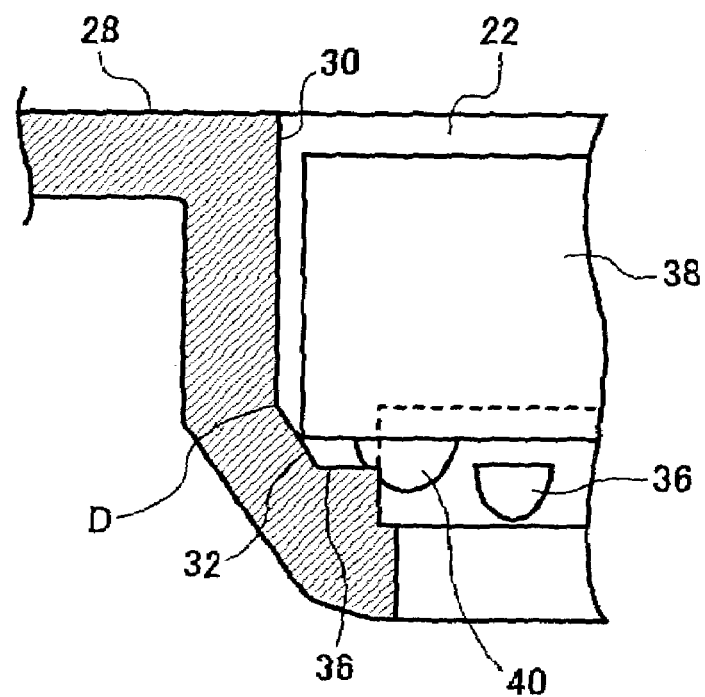
FIG. 2 is an enlarged view of a pocket of the carrier tape illustrated in FIGS. 1A–1C.

FIG. 2 is an enlarged cross section of a portion C of the pocket 22 illustrated in FIG. 1C. The pocket pocket 22 has a sidewall 30, which is perpendicular to the flange 28 from the top thereof to a predetermined point D. From the point D, the sidewall is tapered (i.e., a tapered sidewall 32) such that the area of the bottom surface is smaller than that of the opening of the pocket 22. The tapered sidewall 32 has a projection 36 to support a good 38.

The good 38 is a CSP in this case. On the bottom of the good 38, a solder terminal 40 is formed. The setting state of the good 38 in the pocket 22 is not limited thereto, and is determined depending on the shape, size and the like factors of the good to be contained.

An example of the setting state is that, as illustrated in FIG. 2, the four sides of the good 38 may be supported by the tapered sidewall 32 while the bottom surface of the good 38 is not brought into contact with the projection 36 of the tapered sidewall 32.

Alternatively, when a small good is contained in the pocket 22, the good may be supported by the projection 36 without contacting the tapered sidewall 32.

In any cases, the good 38 is set in the pocket 22 such that the solder terminal 40 and other elements and portions formed on the bottom of the good 38 do not contact the bottom surface of the pocket 22.

In the present invention, the projection 36 may not be formed on the sidewall 32, i.e., the good 38 may be supported by the four tapered sidewalls 32 having no projection.

Referring to FIG. 1A, a recessed portion 33 is formed at portions of the four corners of the pocket 22, which portions are located on the same level as that of the tapered sidewall 32. By forming such a recessed portion 33, the four corners of the good 38 do not contact the four corners of the pocket 22. In addition, the good 38 can be easily set in or taken out of the pocket 22. Further, the good 38 can be stably supported in the pocket 22.

Although a cover tape is not illustrated in FIGS. 1A–1C, a cover tape is provided on the flange portion 28 to seal the opening of the pocket 22 after the good 38 is contained in the pocket 22. As mentioned above, the cover tape is adhered on the flange portion 28 by a heat-pressure method or using an adhesive.

Referring to FIG. 1A, the dummy pocket 24 has a center portion 25a and end portions 25b. A height h of the center portion 25a is smaller than a height H1 of the end portions 25b. The height H1 of the end portions 25b is the same as that of the pocket 22. The sidewalls of the dummy pockets 24 are perpendicular to the flange portion 28 of the carrier tape.

Specific examples of the material for use as the main body 20 of the carrier tape include resins such as polycarbonate, amorphous polyethylene terephthalate (APET) and polystyrene. As the cover tape, polyester and the like resins are preferably used.

The carrier tape containing a good in each pocket is covered with the cover tape to seal the good in the pocket. Then the carrier tape is typically reeled. In the reeled carrier tape, there are various cases in which one of the pockets 22 is located right on another pocket; one of the dummy pockets 24 is located right on a pocket; and other cases.

Figure 3A:
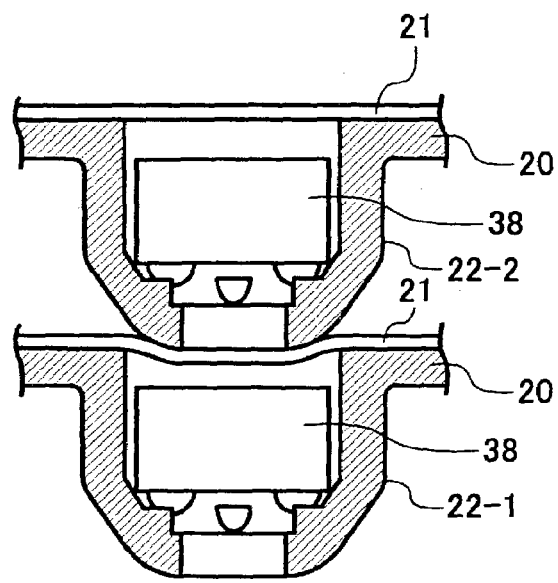
FIG. 3A is a schematic view illustrating the cross section of the first embodiment of the carrier tape, which is reeled, wherein a pocket is located right on another pocket.
Figure 3B:
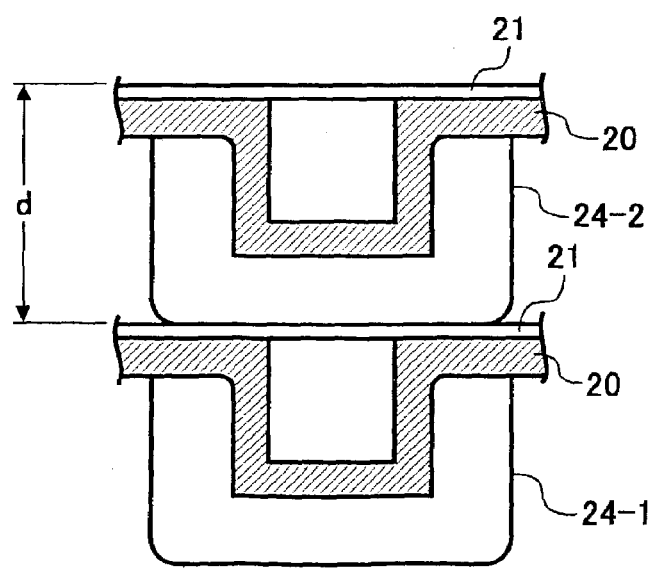
FIG. 3B is a schematic view illustrating the cross section of the first embodiment of the carrier tape, which is reeled, wherein a dummy pocket is located right on another dummy pocket.

FIG. 3A illustrates a case in which one of the pockets 22 is located right on another pocket 22. In this case, two dummy pockets, which are located adjacently to the one of the pockets 22, are also located on other two of the dummy pockets 24 as illustrated in FIG. 3B. The good 38 is contained in the pocket 22, and is sealed with a cover tape 21.

As illustrated in FIG. 3B, the sidewalls of the dummy pocket 24 is perpendicular to the flange portion 28, and the length of the outer surface of the bottom of the dummy pocket length twice the thickness of the main body 20. Therefore the bottom of the upper dummy pocket 24-2 never invades the opening of the lower dummy pocket 24-1. Thus, the distance d between the upper portion of the reeled carrier tape and the lower potion of the reeled portion can be maintained so as to be uniform. Therefore, as illustrated in FIG. 3A, the upper pocket 22-2 is prevented from invading the lower pocket 22-1 although the outer surface of the bottom of the pocket 22 is smaller than the opening of the pocket 22. This is because the distance between the upper portion of the reeled carrier tape and the lower potion of the reeled portion can be maintained so as to be uniform by the dummy pockets located adjacently to the pocket 22.

Figure 4A:
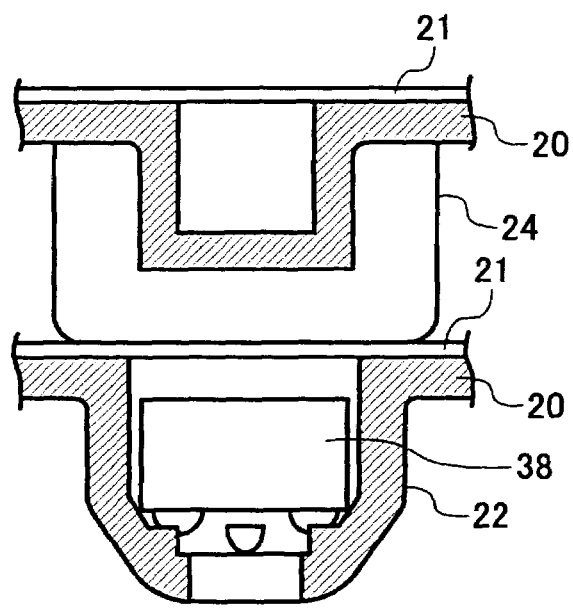
FIG. 4A is a schematic view illustrating the cross section of the first embodiment of the carrier tape, which is reeled, wherein a dummy pocket is located right on a pocket.
Figure 4B:
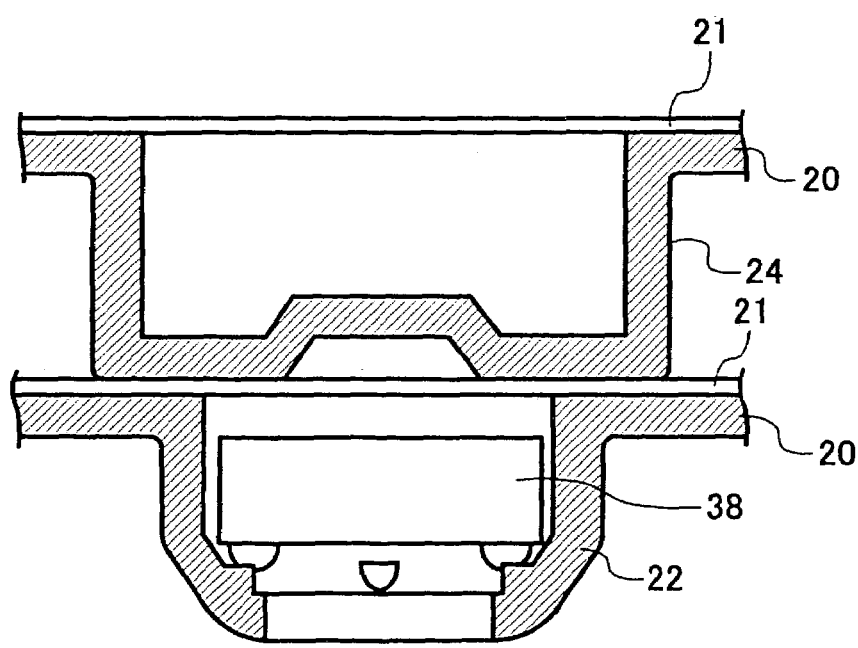
FIG. 4B is a schematic view illustrating the cross section of the carrier tape illustrated in FIG. 4A, wherein the dummy pocket and pocket are cut along a plane perpendicular to the cut plane in FIG. 4A.

In addition, there is a case in which one of the dummy pockets 24 is located right on one of the pockets. FIGS. 4A and 4B illustrate this case. FIG. 4A illustrates the cross section of a reeled carrier tape when the carrier tape is cut at a plane parallel to the longitudinal direction thereof. FIG. 4B illustrates the cross section of the reeled carrier tape when the carrier tape is cut at a plane perpendicular to the longitudinal direction thereof.

As explained above referring to FIGS. 1A–1C, the width X2a of the center portion 25a of the dummy pocket 24 is smaller than the width X1 of the pocket 22, and the height of the center portion 25a is smaller than that of the end portions 25b of the dummy pocket 24. However, since the width X2 of the end portions 25b of the dummy pocket 24 is greater than the width X1 of the pocket 22, the outer surface of the bottom of the dummy pocket 24 can be prevented from invading the opening of the pocket 22 as illustrated in FIG. 4A.

In addition, since the length Y2 of the dummy pocket 24 is greater than the length Y1 of the pocket 22 in the Y direction as illustrated in FIG. 1A, the outer surface of the bottom of the dummy pocket 24 can be prevented from invading the opening of the pocket 22 as illustrated in FIG. 4B.

Example 2

Figure 5A:
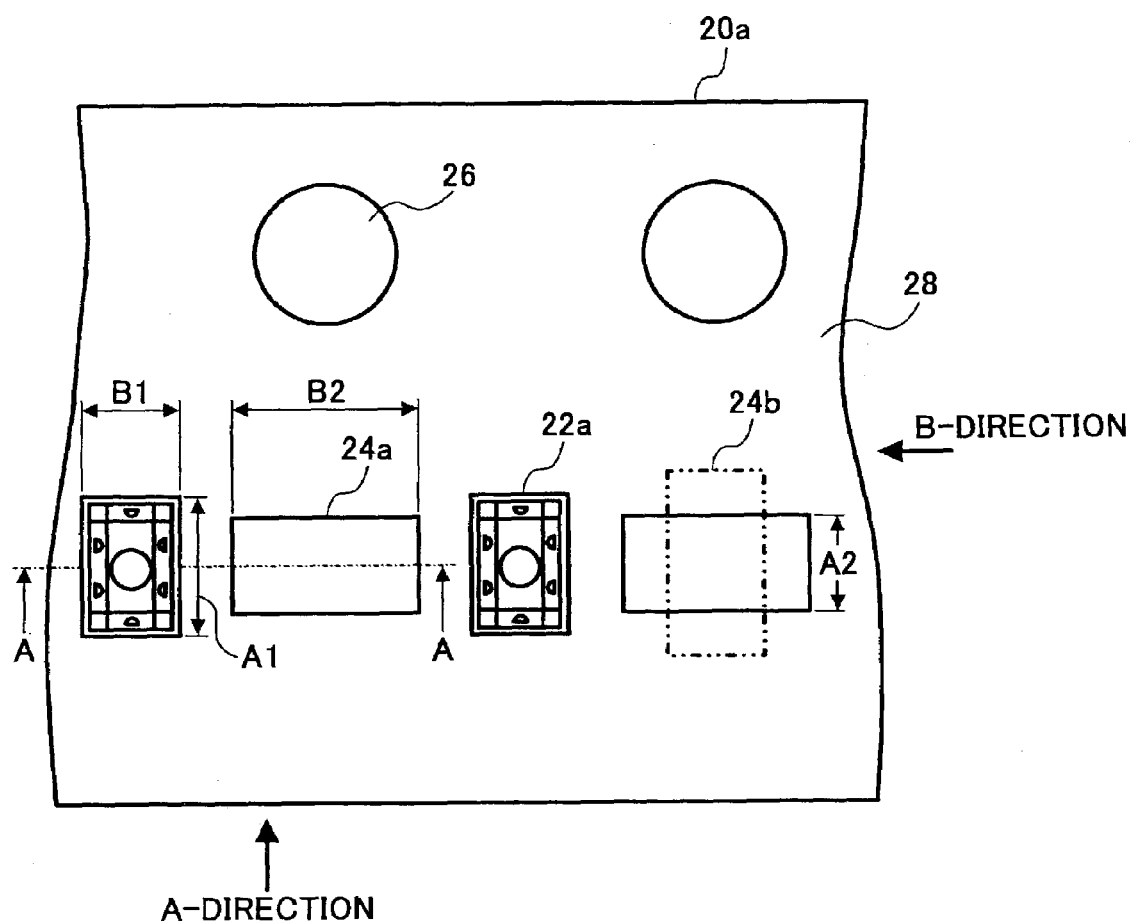
FIG. 5A is a plan view illustrating the second embodiment of the carrier tape of the present invention.
Figure 5B:
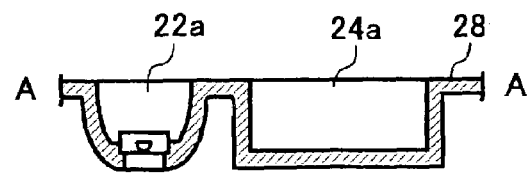
FIG. 5B is a schematic cross-sectional view of the carrier tape illustrated in FIG. 5A when the carrier tape is cut at a line A—A.
Figure 6A:
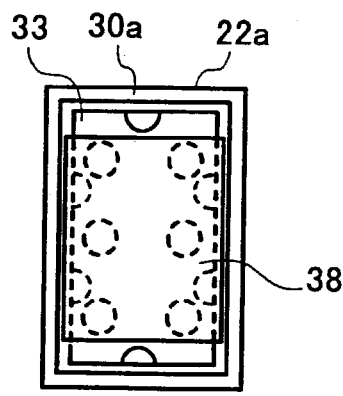
FIGS. 6A and 6B are schematic plan views illustrating the second embodiment (Example 2) of the carrier tape of the present invention in which a good is contained in a pocket.
Figure 6B:
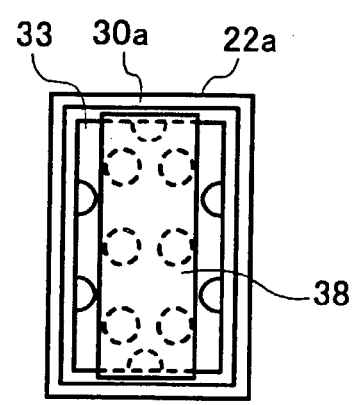
Figure 6C:
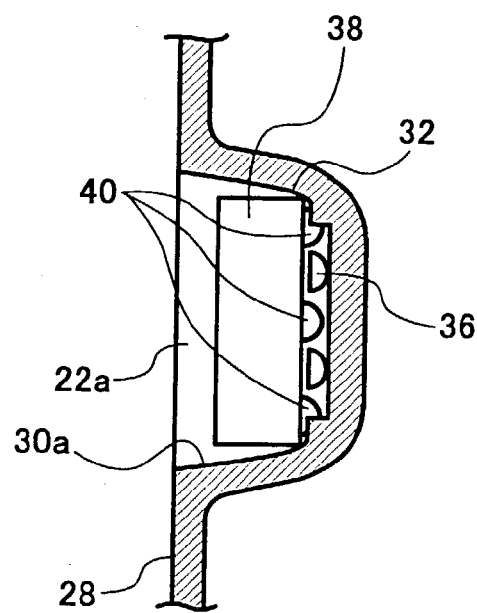
FIG. 6C is a schematic view illustrating the cross section of the second embodiment of the carrier tape of the present invention.
Figure 6D:
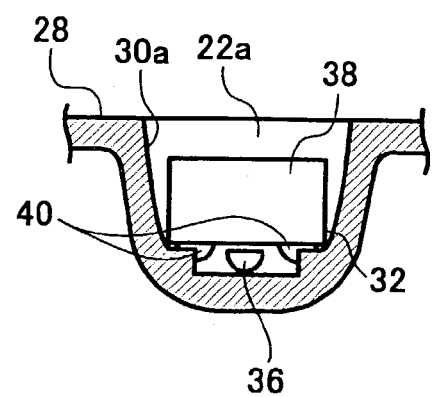
FIG. 6D is a schematic view illustrating the cross-section of the second embodiment of the carrier tape of the present invention when the carrier tape is cut along a plane perpendicular to the cutting plane in FIG. 6C.

FIGS. 5A and 5B illustrate a second example of the carrier tape of the present invention. FIG. 5A is a plan view of the second example of the carrier tape. FIG. 5B is a cross section of the carrier tape when the carrier tape is cut a line A—A. In addition, FIGS. 6A–6D illustrate a pocket of the second example of the carrier tape in which a good is contained in a pocket. FIGS. 6A and 6B are plan views of the pocket. The goods illustrated in FIGS. 6A and 6B have different size. FIG. 6C is a cross section of the pocket when the pocket is cut at a plane perpendicular to the longitudinal direction of the carrier tape. FIG. 6D is a cross section of the pocket when the pocket is cut at a plane parallel to the longitudinal direction of the carrier tape.

The second example is different from the first example in that the shapes of the pockets 22a and the dummy pockets 24a formed between the pockets 22a are different from those of the pockets 22a and the dummy pockets 24a in the first example mentioned above.

Figure 7:
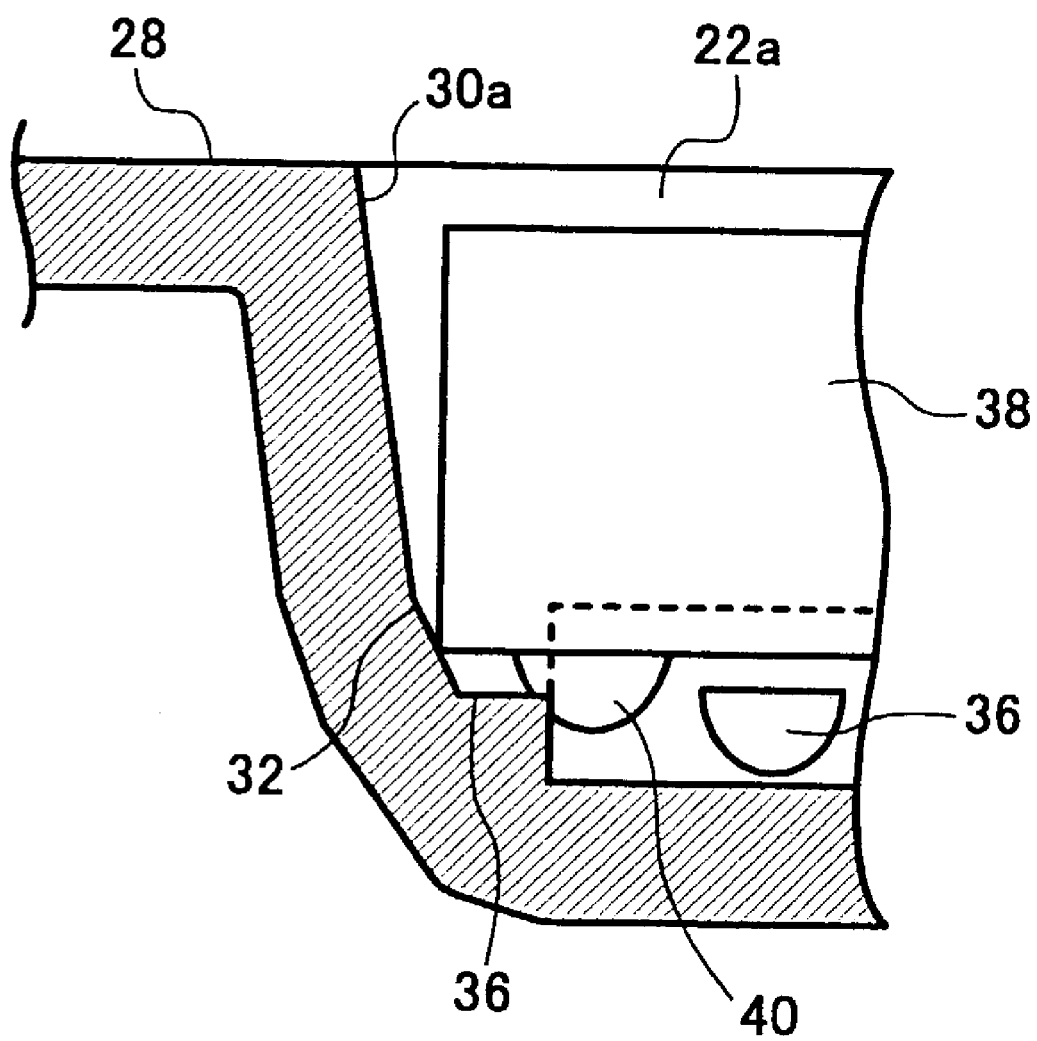
FIG. 7 is an enlarged view of a pocket of the carrier tape illustrated in FIGS. 6A–6D.

As illustrated in cross sections illustrated in FIGS. 6A and 6B and an enlarged view of the pocket 22a illustrated in FIG. 7, sidewalls 30a of the pocket 22a are not perpendicular to the surface of the flange portion 28, and are slanted such that the area of the opening is greater than the area of the bottom surface. Namely, the sidewalls 30a are tapered. Another tapered surfaces 32 are formed at bottom portions of the sidewalls of the pocket 22a. The angle of the tapered sidewalls 30a is greater than that of the tapered surfaces 32. Similarly to Example 1, projections 36 are formed on the tapered surfaces 32.

In addition, portions of the four corners of the pocket 22a which are on the same level as that of the tapered surfaces 32 are not tapered, and therefore recessed portions 33 which are recessed outward are formed thereon similarly to the example illustrated in FIGS. 1A–1C.

FIGS. 6A–6D and 7 illustrate the pocket 22a in which a good 38 is contained. The four sides of the good 38 are supported by the tapered surfaces 32. The good 38 is supported while the bottom of the good 38 is not contacted with the projections 38. When the good 38 has a small size, the bottom surface of the good 38 is supported by the projections 36 while contacting the projections 36. In any case, solder terminals 40 do not contact the bottom surface of the pocket 22a.

The sidewalls of the dummy pocket 24a are formed so as to perpendicular to the surface of the flange portion 28 of the main body. The dummy pocket 24a has a uniform depth and height. In a case of the carrier tape illustrated in FIG. 5A, a length B2 of the dummy pocket 24a in the longitudinal direction is longer than a length B1 of the pocket 22a, and a width A2 of the dummy pocket 24a is narrower than a width A1 of the pocket 22a. The height of the dummy pocket 24a is the same as or greater than that of the pocket 22a.

Figure 8A:
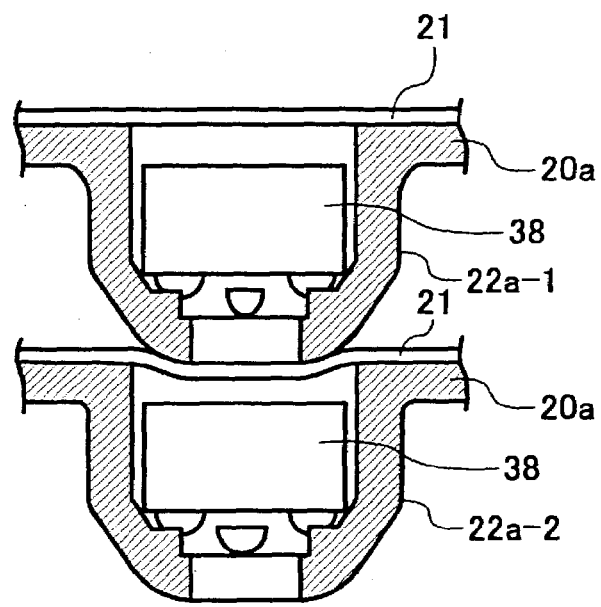
FIG. 8A is a schematic view illustrating the cross section of the second embodiment of the carrier tape, which is reeled, wherein a pocket is located right on another pocket.
Figure 8B:
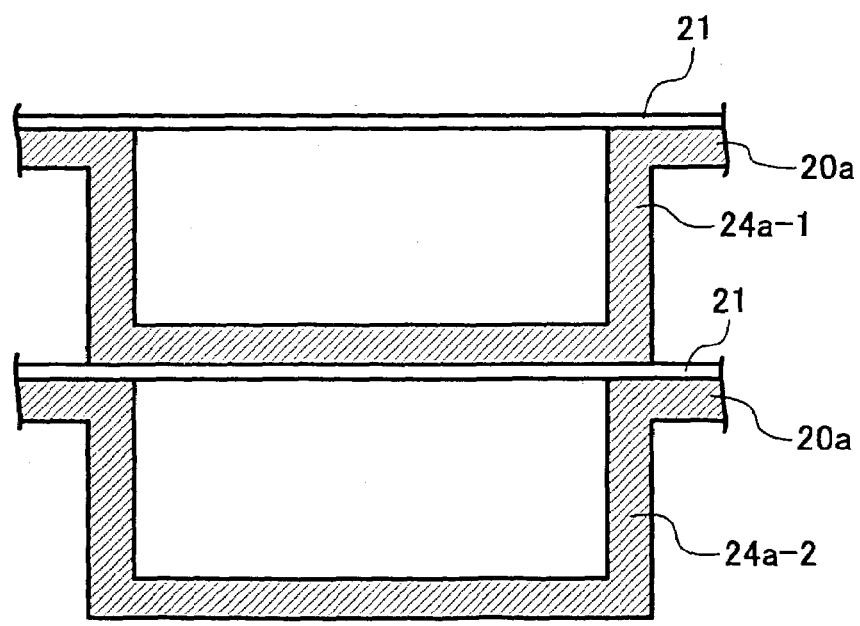
FIG. 8B is a schematic view illustrating the cross section of the second embodiment of the carrier tape, which is reeled, wherein a dummy pocket is located right on another dummy pocket.

FIG. 8A illustrates a portion of a reeled carrier tape in which one of the pockets 22a-1 is located right on another of the pockets 22a-2. In this case, one of the dummy pockets 24a-1 adjacent to the upper pocket 22a1 is also located on another of the dummy pockets 24a-2 as illustrated in FIG. 8B.

Since the sidewalls of the dummy pockets 24a-1 and 24a-2 are vertically formed, the area of the outer bottom surface of the dummy pockets 24a-1 and 24a-2 is greater than that of the opening thereof. Therefore, the nesting problem in that the bottom surface of the upper dummy pocket 24a-1 invades the opening of the lower dummy pocket 24a-2 can be prevented.

Accordingly, the bottom portion of the upper pocket 22a-1, which is located adjacently the two dummy pockets 24a-3, does not invade into the opening of the lower pocket 22a-4, resulting in prevention of the nesting problem.

Figure 9A:
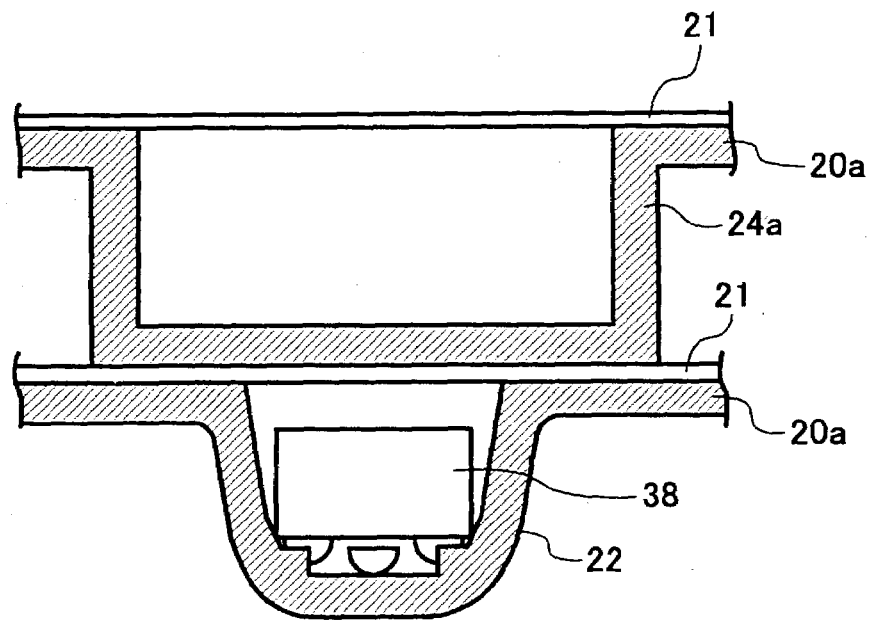
FIGS. 9A and 9B are schematic views illustrating the cross sections of the second embodiment of the carrier tape, which is reeled, wherein a dummy pocket is located right on a pocket.
Figure 9B:
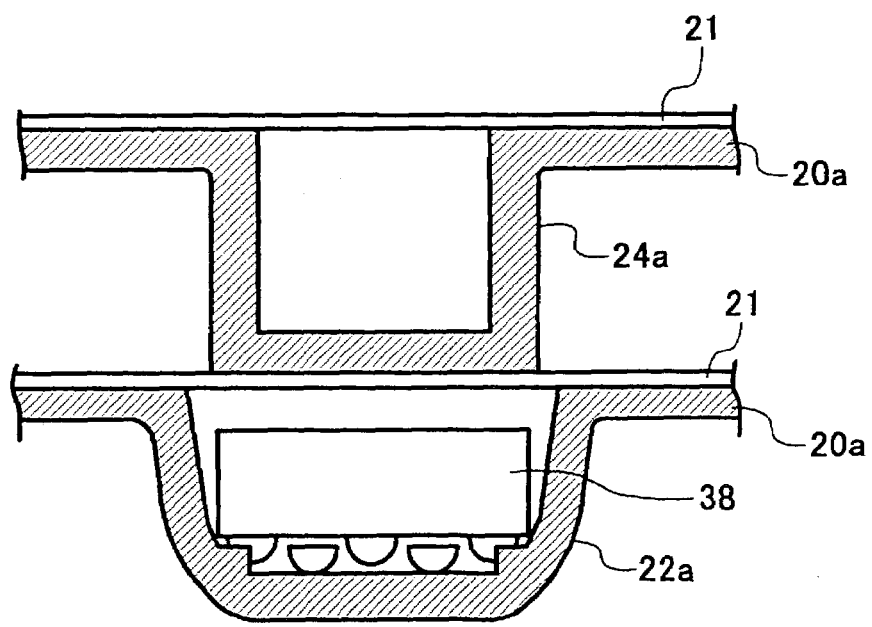

FIGS. 9A and 9B illustrate a portion of the reeled carrier tape in which one of the dummy pockets 24a is located right on one of the pockets 22a are overlaid. FIG. 9A is a cross section of the carrier tape illustrated in FIG. 5A when the carrier tape is cut along the line A—A (i.e., the longitudinal direction) and FIG. 9B is a cross section of the carrier tape when the carrier tape is cut along a plane perpendicular to the line A—A (i.e., the longitudinal direction).

As illustrated in FIGS. 9A and 9B, the length of the dummy pockets 24a in the longitudinal direction is longer than that of the pocket 22a, and therefore the nesting problem in that the bottom of the dummy pocket 24a invades the opening of the pockets 22a is not caused.

Example 3

Figure 10A:
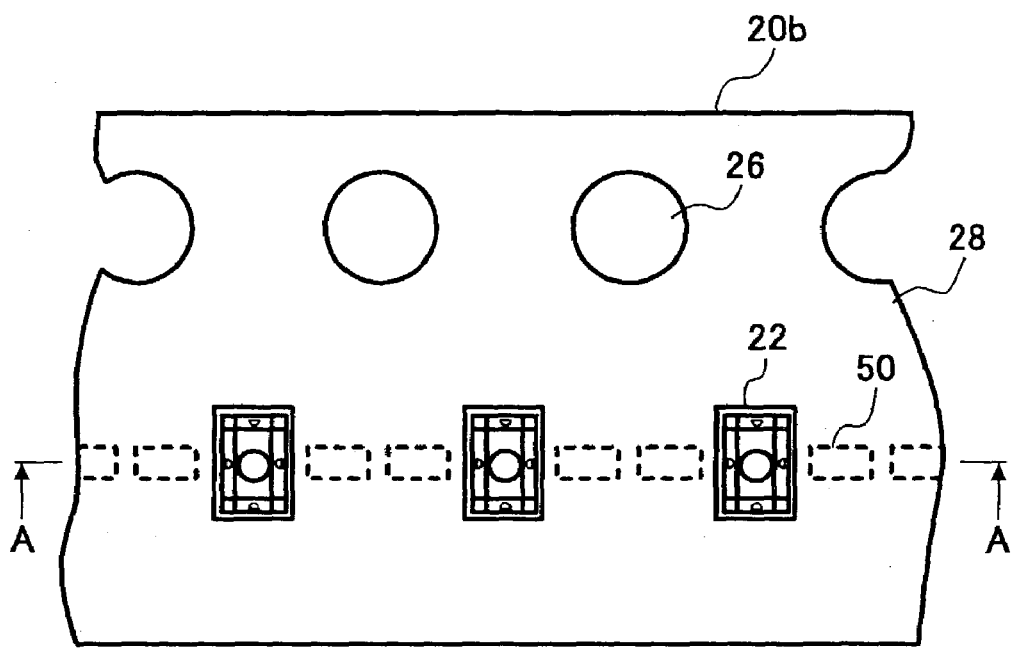
FIG. 10A is a plan view illustrating the third embodiment (Example 3) of the carrier tape of the present invention.
Figure 10B:
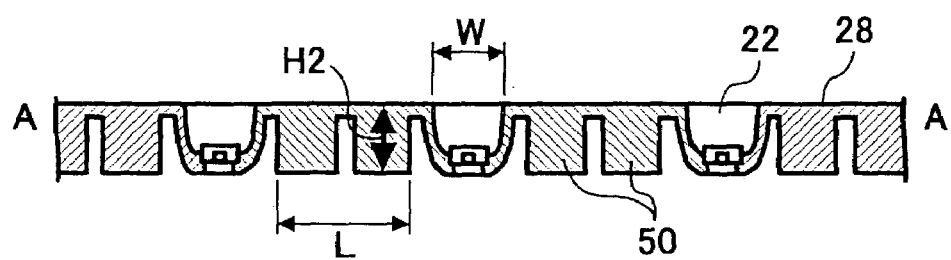
FIG. 10B is a schematic cross-sectional view of the carrier tape illustrated in FIG. 5A when the carrier tape is cut at a line A—A.
Figure 11A:
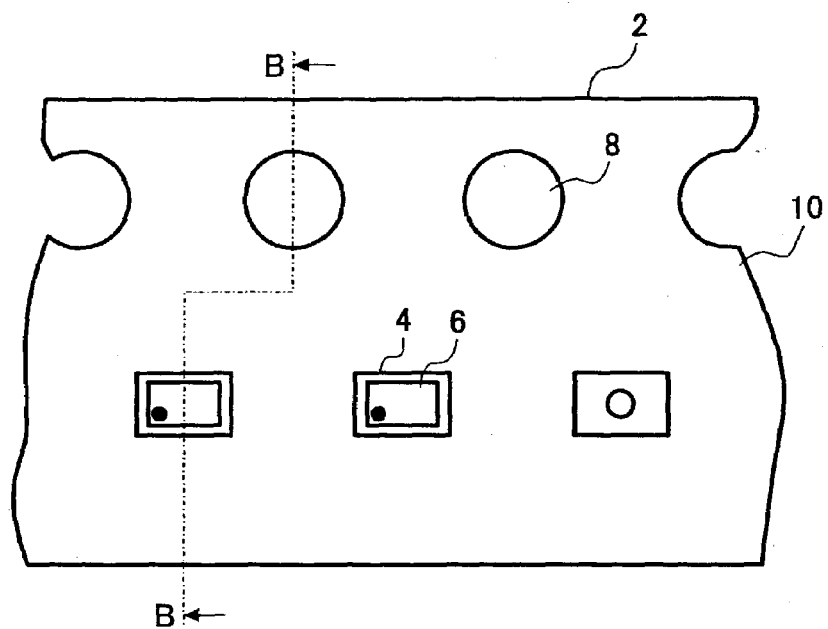
FIG. 11A is a schematic plan view illustrating a conventional carrier tape.
Figure 11B:
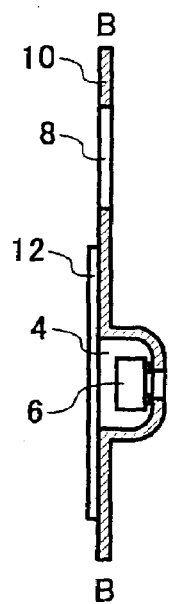
FIG. 11B is a cross-sectional view of the conventional carrier tape illustrated in FIG. 11A when the carrier tape is cut at a line B—B.
Figure 12:
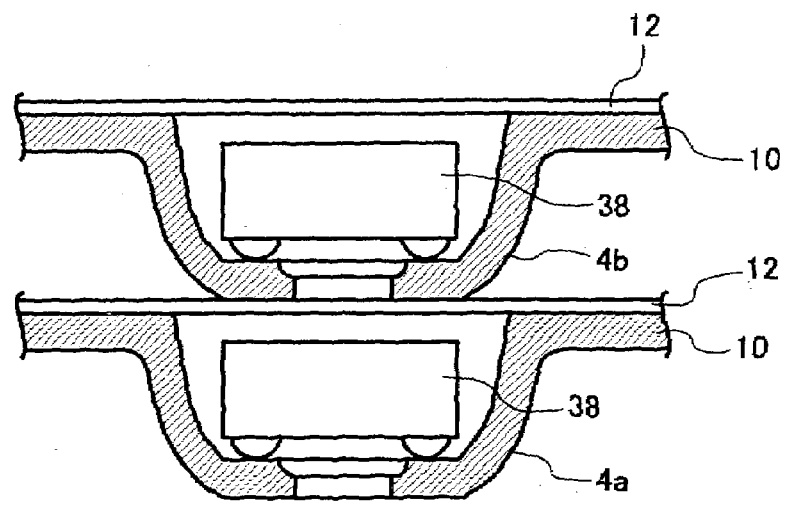
FIG. 12 is a cross-sectional view of the conventional carrier tape illustrated in FIG. 11A, which is reeled, wherein a pocket is located right on another pocket.
Figure 13:
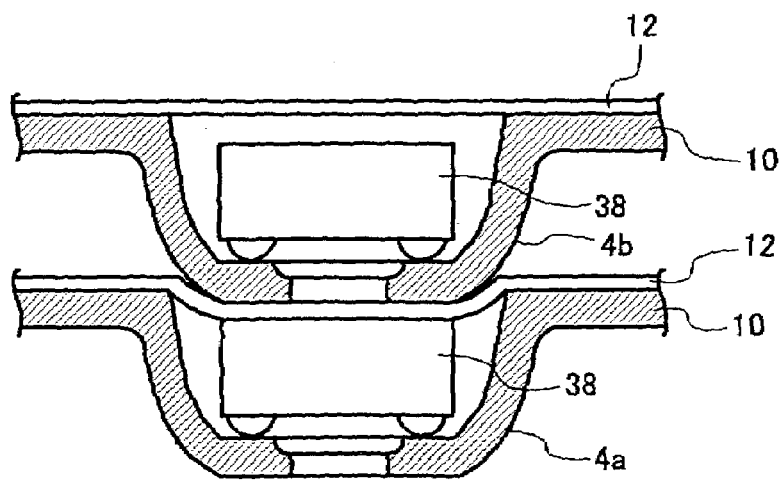
FIG. 13 is a cross-sectional view of the conventional carrier tape illustrated in FIG. 11A, which is reeled, wherein a pocket located right on another pocket invades the lower pocket.

FIG. 10 illustrates a third example of the carrier tape of the present invention. FIGS. 10A and 10B are a plan view and a cross section of the third example of the carrier tape. As illustrated in FIGS. 10A and 10B, ribs 50 having a plate shape are formed on the backside (i.e., the side opposite to the flange portion 28) of the main body 20b of the carrier tape, while the ribs 50 are integrated with the main body 20a. The ribs 50 have a plate shape in which the length of the ribs in the longitudinal direction of the carrier tape is longer than the width of the ribs. In addition, the ribs 50 are not integrated with the pockets 22. The ribs are separated into two pieces in the longitudinal direction of the carrier tape. A total length L of the ribs 50 is longer than a length W of the opening of the pocket 22. A height of the ribs 50 is the same as the height of the pocket 22.

In the third example, even when the carrier tape is reeled such that one of the pockets 22 is located right on another of the pockets 22, the distance between the outer portion of the carrier tape and the inner portion thereof can be uniformly maintained due to the ribs 50, and thereby the nesting problem in that the bottom portion of the upper one of the pockets 22*a* invades the opening of the lower one of the pockets 22*a*.

Even when one of the ribs 50 is located right on one of the pockets 22, the ribs never invade the opening of the pocket 22 because the length L of the ribs is longer than the length W of the pocket 22.

EFFECTS OF THE PRESENT INVENTION

Since plural dummy pockets including at least a portion having a height equal to or greater than the height of plural pockets formed on a carrier tape are arranged on the carrier tape, the nesting problem can be prevented when the carrier tape is reeled after the pockets and the dummy pockets are covered with a cover tape (i.e., the resultant container is reeled) and one of the pockets is located right on another of the pockets, because the dummy pockets can maintain the distance between a lower portion of the reeled carrier tape and an upper portion located on the lower portion.

When plural plate-shaped ribs having a height equal to or greater than the height of the plural pockets formed on a carrier tape are arranged on the carrier tape, the nesting problem can also be prevented when the resultant container is reeled, because the ribs can maintain the distance between a lower portion of the reeled carrier tape and an upper portion located on the lower portion.

Additional modifications and variations of the present invention are possible in light of the above teachings. It is therefore to be understood that within the scope of the appended claims the invention may be practiced other than as specifically described herein.

This document claims priority and contains subject matter related to Japanese Patent Application No. 2002-118618, filed on Apr. 19, 2002, the entire contents of which are herein incorporated by reference.

What is claimed is:

1. A carrier tape comprising:

a main body having a thickness;

plural content pockets arranged on one side of the main body at equal intervals in a longitudinal direction of the main body to contain goods, wherein the plural content pockets have openings on the same level as a surface of the main body and bottoms, and have depths greater than the thickness of the main body; and plural dummy pockets arranged on the one side of the main body in the longitudinal direction of the main body, wherein the plural dummy pockets have openings and bottoms, and wherein the plural dummy pockets extend away from the main body no less than the plural content pockets, wherein a dimension of an opening in the longitudinal direction of the main body of each of said dummy pockets is different than a dimension of an opening in the longitudinal direction of the main body of each of said content pockets, and wherein the dummy pockets are shaped and dimensioned relative to the plural content pockets such that when one of the dummy pockets is centered over one of the plural content pockets, the one of the dummy pockets does not invade into the one of the plural content pockets.

2. The carrier tape according to claim 1, wherein the dummy pockets are dimensioned such that when one of the dummy pockets is centered over one of the plural content pockets, at least one portion of an outer surface of the bottom of the one dummy pocket extends off the opening of the one pocket.

3. The carrier tape according to claim 2, wherein an outer surface of a bottom of a dummy pocket has a shape different from a shape of an opening of one of the plural content pockets.

4. The carrier tape according to claim 2, wherein the plural dummy pockets have central portions and end portions in at least one of the longitudinal direction of the main body and the direction perpendicular to the longitudinal direction, and the end portions extend away from the main body less than the central portion, and wherein the plural dummy pockets have a shape such that when one of the plural dummy pockets is centered over one of the plural content pockets, the outer surface of the bottom of at least a portion of both the end portions of the dummy pocket extends off the opening of said one of the plural content pockets.

5. The carrier tape according to claim 2, wherein the plural dummy pockets have end portions spaced in a direction perpendicular to the longitudinal direction by central portions that are narrower than the end portions in the longitudinal direction, and wherein the plural dummy pockets have a shape such that when one of the plural dummy pockets is centered over one of the plural content pockets, at least one portion of the bottom of both the end portions of the dummy pocket extends off the opening of said one of the plural content pockets.

6. The carrier tape according to claim 1, wherein the plural dummy pockets have sidewalls that are substantially perpendicular to the surface of the main body and the openings of the plural dummy pockets are shaped as an inner surface of the bottoms thereof.

7. The carrier tape according to claim 1, wherein the openings and bottoms of the plural content pockets are substantially rectangular and the plural pockets have sidewalls tapered such that the openings are larger than an inner surface of the bottoms.

8. The carrier tape according to claim 7, wherein the sidewalls have projections configured to support bottoms of the goods such that the goods do not contact the inner surface of the bottoms of the plural content pockets.

9. The carrier tape according to claim 7, wherein the sidewalls have corners recessed outward.

10. A carrier tape comprising:

a main body having a thickness;

plural content pockets arranged on one side of the main body at equal intervals in a longitudinal direction of the main body to contain goods, wherein the plural content pockets have openings on the same level as a surface of the main body and bottoms, and wherein the plural content pockets are deeper than the thickness of the main body; and plural ribs arranged on the one side of the main body in the longitudinal direction of the main body and each having a plate shape and at least a portion extending away from the main body no less than the plural content pockets, wherein a dimension of each rib in the longitudinal direction is greater than a dimension of the opening of each pocket, and wherein the plural ribs are integrated with the main body.

11. The carrier tape according to claim 10, wherein each of the ribs is separated into plural pieces in the longitudinal direction of the main body.

12. The carrier tape according to claim 10, wherein the openings and bottoms of the plural pockets are substantially rectangular and the plural pockets are substantially rectangular and the plural pockets have sidewalls tapered such that the openings of the plural pockets are larger than an inner surface of their bottoms.

13. The carrier tape according to claim 12, wherein the sidewalls have projections configured to support the goods such that the goods do not contact the inner surface of the bottoms of the plural pockets.

14. The carrier tape according to claim 12, wherein the sidewalls have corners recessed outward.

15. A container comprising:

the carrier tape according to claim 1; and a resin cover tape configured to cover the openings of the plural content pockets and the plural dummy pockets of the carrier tape to seal the goods into the plural content pockets.

16. The container according to claim 15, wherein the carrier tape with the resin cover tape is reeled such that the resin cover tape faces outward.

17. A container comprising:

the carrier tape according to claim 10; and a resin cover tape configured to cover the openings of the plural pockets of the carrier tape to seal the goods into the plural pockets.

18. The container according to claim 17, wherein the carrier tape with the resin cover tape is reeled such that the resin cover tape faces outward.

19. A carrier tape comprising:

an elongated, tape-shaped, flexible main body;

first pockets for containing goods, said first pockets being integral with the main body and having openings at the main body and bottoms extending to a first distance from the main body;

said first pockets being spaced from each other along a length of the main body; and dummy spacers integral with the main body and interspersed with said first pockets along the length of the main body;

said dummy spacers having bottoms extending to a second distance from the main body that is no less than said first distance, wherein a dimension in a longitudinal direction of the main body of each of said dummy spacers is different than a dimension in the longitudinal direction of the main body of each of said first pockets, and wherein said first pockets and dummy spacers are shaped and dimensioned to keep any of the bottoms of said first pockets and dummy spacers from intruding into any of the openings of said first pockets when the carrier tape is wound in a reel.

20. A carrier tape as in claim 19 in which said dummy spacers comprise dummy pockets having openings at the main body.

21. A carrier tape as in claim 19 in which said dummy spacers comprise ribs extending from the main body.

22. A carrier tape as in claim 19 in which the bottoms of said dummy spacers are larger in at least one dimension than the openings of said first pockets.

23. A carrier tape as in claim 19 in which said first pockets are shaped relative to first goods contained in said first pockets to keep the first goods from making contact with an inner surface of the bottoms of the first pockets.

* * * * *